United States Patent
Inada et al.

(10) Patent No.: US 9,634,009 B1
(45) Date of Patent: Apr. 25, 2017

(54) SYSTEM AND METHOD FOR SOURCE-DRAIN EXTENSION IN FINFETS

(71) Applicant: International Business Machines Corporation, Armonk, NY (US)

(72) Inventors: Atsuro Inada, Albany, NY (US); Sivananda K. Kanakasabapathy, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/974,436

(22) Filed: Dec. 18, 2015

(51) Int. Cl.
| | |
|---|---|
| *H01L 27/092* | (2006.01) |
| *H01L 29/78* | (2006.01) |
| *H01L 21/8238* | (2006.01) |
| *H01L 29/49* | (2006.01) |
| *H01L 29/66* | (2006.01) |
| *H01L 29/06* | (2006.01) |
| *H01L 21/311* | (2006.01) |

(52) U.S. Cl.
CPC .... *H01L 27/0924* (2013.01); *H01L 21/31105* (2013.01); *H01L 21/823814* (2013.01); *H01L 21/823821* (2013.01); *H01L 21/823864* (2013.01); *H01L 29/0649* (2013.01); *H01L 29/4975* (2013.01); *H01L 29/665* (2013.01); *H01L 29/6653* (2013.01); *H01L 29/6656* (2013.01); *H01L 29/66795* (2013.01); *H01L 29/7856* (2013.01)

(58) Field of Classification Search
CPC ....... H01L 21/31105; H01L 21/823814; H01L 21/823821; H01L 21/823864; H01L 27/0924; H01L 29/0649; H01L 29/4975; H01L 29/665; H01L 29/6653; H01L 29/6656; H01L 29/66795
See application file for complete search history.

(56) References Cited

U.S. PATENT DOCUMENTS

| | | | |
|---|---|---|---|
| 5,183,771 | A | 2/1993 | Mitsui et al. |
| 5,714,413 | A | 2/1998 | Brigham et al. |
| 6,245,620 | B1 | 6/2001 | Jang et al. |
| 6,737,342 | B1 | 5/2004 | Lee et al. |
| 6,911,695 | B2 | 6/2005 | Ahmed et al. |

(Continued)

OTHER PUBLICATIONS

V. Subramanian et al., "Identifying the Bottlenecks to the RF Performance of FinFETs," 23rd International Conference on VLSI Design. VLSID '10. Jan. 3-7, 2010, pp. 111-116.

*Primary Examiner* — Christine Enad
(74) *Attorney, Agent, or Firm* — Harrington & Smith; Louis J. Percello

(57) ABSTRACT

A fin-type field effect transistor (finFET) device includes a gate disposed over at least two fins, each fin defining a source outboard portion and a drain outboard portion extending beyond the gate. There is a source contact that electrically connects the source outboard portions of the fins, and similarly on the opposed side of the gate there is a drain contact electrically connecting the drain outboard portions of the fins. A first dielectric spacer layer is disposed adjacent to the gate and overlying the fins, and a second dielectric spacer layer is disposed adjacent to the first spacer layer and also overlying the fins. The second dielectric spacer layer electrically isolates the gate from the drain contact and/or from the source contact. A method of making a finFET device is also detailed.

17 Claims, 10 Drawing Sheets

(56) References Cited

U.S. PATENT DOCUMENTS

| | | |
|---|---|---|
| 6,921,982 B2 | 7/2005 | Joshi et al. |
| 6,924,178 B2 | 8/2005 | Beintner |
| 6,995,065 B2 | 2/2006 | Chou et al. |
| 7,365,378 B2 | 4/2008 | Huang et al. |
| 7,704,835 B2 | 4/2010 | Singh et al. |
| 8,362,568 B2 * | 1/2013 | Lin .................. H01L 29/66636 257/288 |
| 8,492,228 B1 * | 7/2013 | Leobandung ... H01L 21/823443 257/308 |
| 8,617,426 B2 | 12/2013 | Hartmann et al. |
| 8,722,494 B1 | 5/2014 | Basker et al. |
| 8,799,848 B1 | 8/2014 | Haensch et al. |
| 8,946,791 B2 * | 2/2015 | Basker .............. H01L 29/66795 257/288 |
| 9,390,981 B1 * | 7/2016 | Basker ............ H01L 21/823814 |
| 2011/0034020 A1 | 2/2011 | Johnson |
| 2012/0193712 A1 * | 8/2012 | Bryant .............. H01L 29/41791 257/347 |
| 2014/0061734 A1 * | 3/2014 | Basker .............. H01L 29/66795 257/288 |
| 2014/0167163 A1 | 6/2014 | Cheng et al. |
| 2015/0014788 A1 * | 1/2015 | Park ................. H01L 29/66545 257/401 |
| 2016/0190137 A1 * | 6/2016 | Tsai .................... H01L 27/0924 257/369 |

* cited by examiner

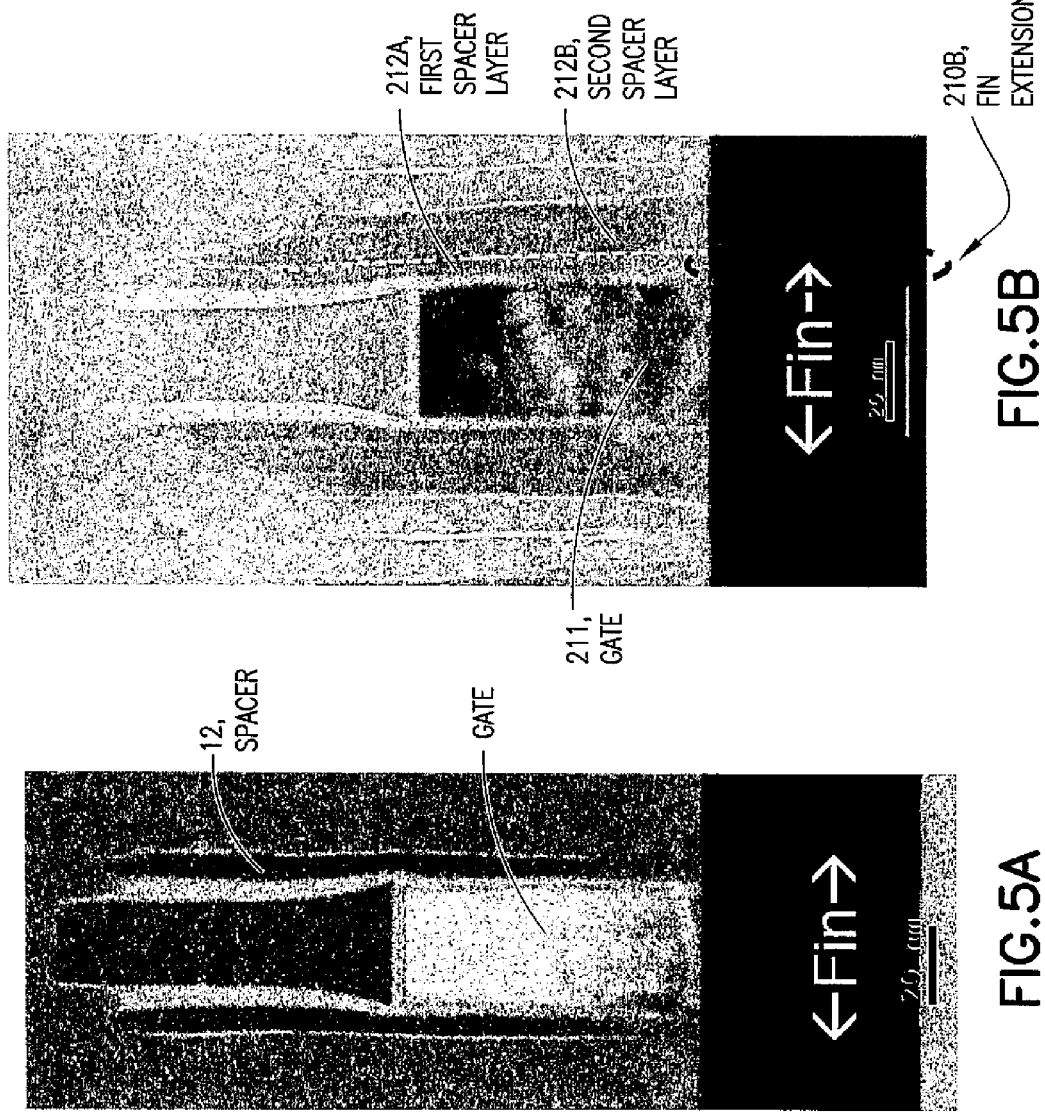

SYSTEM AND METHOD FOR SOURCE-DRAIN EXTENSION IN FINFETS

TECHNICAL FIELD

The exemplary embodiments of this invention relate generally to semiconductor devices and, more specifically, to semiconductor devices having FinFETS with a common source and/or drain.

BACKGROUND

Fin type field effect transistors (FinFETs) are well known in the micro-circuitry arts; see for example co-owned U.S. Pat. Nos. 6,921,982; 8,362,568; 8,617,426; 8,799,848 and 8,722,494. FinFETs are typically complementary metal-oxide semiconductor (CMOS) devices in which the channel of the transistor is characterized in having a substantial dimension perpendicular to the base on which the channel lies. Among other advantages this physical layout allows the transistor's gate to cover the top and both sides of the channel, enabling more effective gate control and better reducing current leakage.

FinFETs are widely deployed in arrays in which parallel fins 10 are controlled by a common gate 11 or finger as shown at FIG. 1A. Typically there is a dielectric spacer 12 about the gate 11, commonly formed of an oxide, nitride, and/or oxynitride such as a silicon oxide or a silicon nitride (or carbon and/or boron doped oxides or oxynitirides of silicon) which during manufacture of the host chip is deposited via chemical vapor deposition (CVD), plasma enhanced CVD (PECVD) or physical vapor deposition (PVD) and etched using reactive ion etching (RIE) for example. On the chip substrate there may be an epitaxially grown source-drain region adjacent to the ends of the fins 10 which is shown in FIG. 1B as the epi-merge region 14 and operates to merge the sources and drains of multiple fins. Further details of such an epitaxially grown source-drain region can be seen at co-owned US Patent Application Publication No. 2014/0167163, the contents of which are hereby incorporated by reference. In the epi-merge region 14 in a FinFET array a cladding layer 15 is typically grown epitaxially on the fin 10 to insert dopants that form the junction for current injection into the channel.

Current leakages and parasitic capacitances that are negligible in larger electronic devices become first order limits as transistors scale to line widths of 40 nm and less. FIG. 1C is an expanded view of the inset from FIG. 1B, and shows the spacer layer has an overlay capacitance $C_{ov}$ and also the epi-merge source/drain region 14 has a source/drain (S/D) capacitance $C_{eff}$. It is preferable to be able to set the overlay capacitance $C_{ov}$ relatively high to ensure good isolation of the gate from the source and drain and it is also preferable to have the S/D capacitance $C_{eff}$ of the epi-merge source/drain regions 14 optimized for faster switching. Relevant teachings in this regard may be seen in a paper by V. Subramanian et al. entitled *Identifying bottlenecks to the RF performance of FinFETs* [23$^{RD}$ INTERNATIONAL CONFERENCE ON VLSI DESIGN, 2010; pages 111-116]. But in the current state of the art $C_{ov}$ and $C_{eff}$ are set by the same geometry; the thickness of the spacer layer and the dielectric constant K of the material from which it is made can be designed to yield a high overlay capacitance $C_{ov}$ but this would also increase the S/D capacitance $C_{eff}$ of the epi-merged source and drain regions 14. This same geometry also sets the diffusion of dopants from the cladding 15 into the extension of the fin 10 beyond the source and drain, and this diffusion is biased by the overlay capacitance $C_{ov}$ as FIG. 1C shows.

Embodiments of these teachings enable a high dopant dose and high overlay capacitance $C_{ov}$ with an optimized/D capacitance $C_{eff}$ of the epi-merge source and drain regions 14.

SUMMARY

In a first aspect thereof the embodiments of these teachings provide a fin-type field effect transistor (finFET) device, comprising a gate disposed over at least two fins, each fin defining a source outboard portion and a drain outboard portion extending beyond the gate. There is a source contact that electrically connects the source outboard portions of the fins, and similarly on the opposed side of the gate there is a drain contact electrically connecting the drain outboard portions of the fins. A first dielectric spacer layer is disposed adjacent to the gate and overlying the fins, and a second dielectric spacer layer is disposed adjacent to the first spacer layer and also overlying the fins. The second dielectric spacer layer electrically isolates the gate from the source contact and/or the drain contact.

In a second aspect thereof embodiments of these teachings include a method of making a finFET device, comprising: disposing a gate over at least two fins, each fin defining a source outboard portion and a drain outboard portion extending beyond the gate. After that there is disposed a first dielectric spacer layer adjacent to the gate and overlying the fins. Then a second dielectric spacer layer is disposed adjacent to the first dielectric spacer layer and overlying the fins. The source outboard portions of the fins are electrically connected via a source contact such that the second dielectric spacer layer electrically isolates the gate from the source contact, and/or the drain outboard portions of the fins are electrically connected via a drain contact such that the second dielectric spacer layer electrically isolates the gate from the drain contact.

These and other aspects of the invention are set forth below with particularity.

BRIEF DESCRIPTION OF THE DRAWINGS

FIGS. 5A-B are micrographs of the first embodiment shown at FIGS. 2A-C.

DETAILED DESCRIPTION

According to an embodiment of these teachings there is at least a first and a second spacer layer over the fin outside of the channel. The first spacer layer is adjacent to the gate and is used to set the overlay capacitance $C_{ov}$ and this also determines ingress of dopant from the cladding layer into the extension region of the fin that lies just beyond or even partially underneath the gate. The second spacer layer separates the gate from the merged/common source and drain regions. The first and second spacer layers overlie one another and so as an added benefit this additional (first) spacer layer increases the separation of the gate from the merged/common source and drain regions, as compared to the separation defined by only the second spacer layer. This better isolates the gate from the source/drain regions that lie between and electrically connect two fins.

The fin is typically formed from silicon or from a silicon-germanium (SiGe) or silicon-carbon (SiC) substrate. One or more gate electrodes are disposed over the top and sides of the fin. Adjacent each end of the fin are formed two high density doped (HDD) regions forming at one end a source HDD region and at the opposed end a drain HDD region. It is known to form low density doped (LDD) extension regions within the channel/fin adjacent to or even partially underlying the gate, such that a given fin will have a source LDD extension region and drain LDD extension region on opposed sides of the gate. In embodiments of these teachings these LDD extension regions are formed as one with the first spacer layer.

Preferably there is a cladding layer grown on at least the sidewalls of the fins that lay adjacent to the common epi-merge source/drain regions. The cladding layer can be epitaxially grown, and nFET and pFET performance can be enhanced by using phosphorous- or arsenic-doped Si (nFET) or by using boron-doped SiGE or Ge (pFET). Other known epi cladding semiconductor materials include indium gallium arsenide ($In_xGa_{1-x}As_y$), indium antimonide ($In_xSb_y$), indium gallium phosphide ($In_xGa_{1-x}P_y$), carbon nanotubes (CNT) and alloys of silicon and carbon (SiC).

Figure 2A:
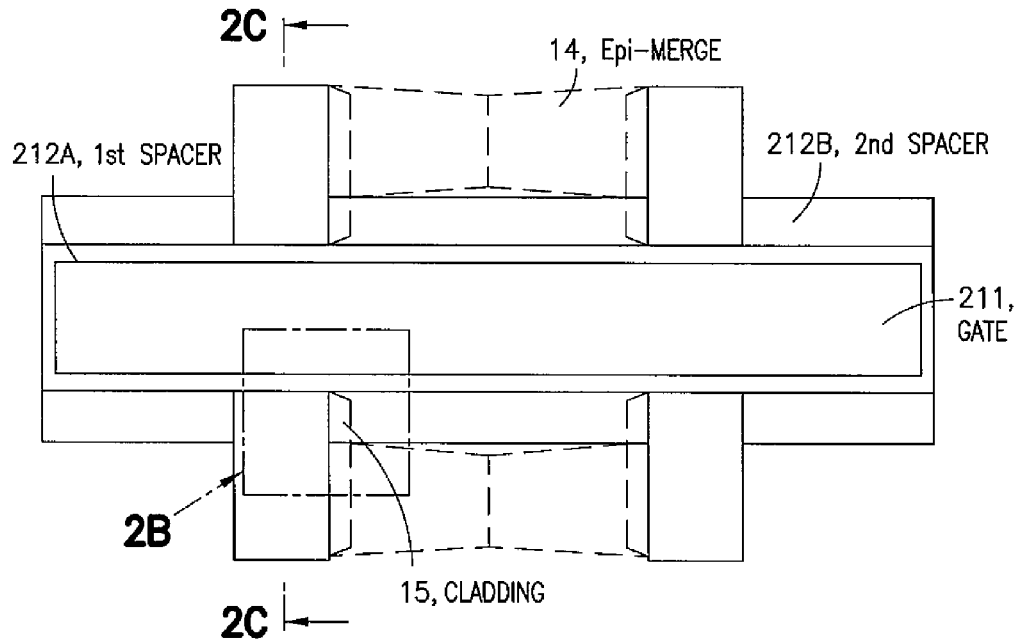
FIG. 2A is similar to FIG. 1A but showing multiple spacers about the gate according to an embodiment of these teachings.

FIG. 2A is a schematic plan view of a FinFET array of two parallel fins 210 with a common gate 211. There is an epitaxially grown merge area 14 that on one side of the gate 211 is a common source region and on the opposed side is a common drain region. At least along the surfaces of the fins 210 adjacent to the epi-merge regions 14 is a cladding layer 15 as described above. The finFET channel extends between the source and the drain and the length of the channel may be considered to be equal to the width of the gate 211. Those portions of the fin 210 that extend beyond the channel/gate are termed outboard fin portions 210A and it is on at least some of these portions 210A that the cladding layer 15 is disposed. There are common source and drain regions 14 that electrically connect the sources and drains of the individual finFET devices that share a common gate 211. Adjacent to the gate 211 is a first spacer layer 212A, and enveloping the first spacer layer 212A is a second spacer layer 212B.

Figure 2B:
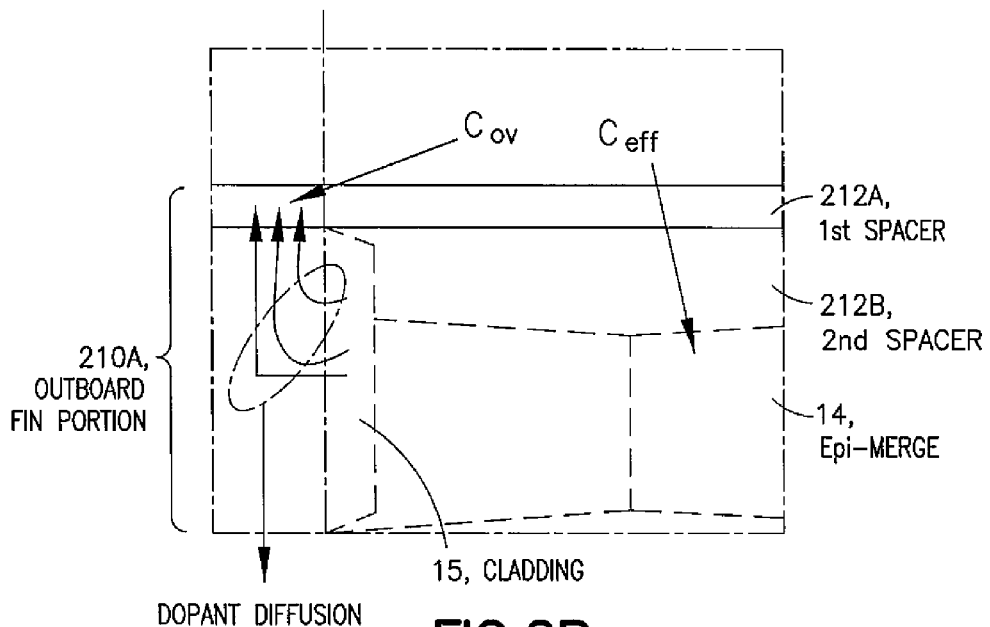
FIG. 2B is an expanded view of an inset from FIG. 2A.
Figure 2C:
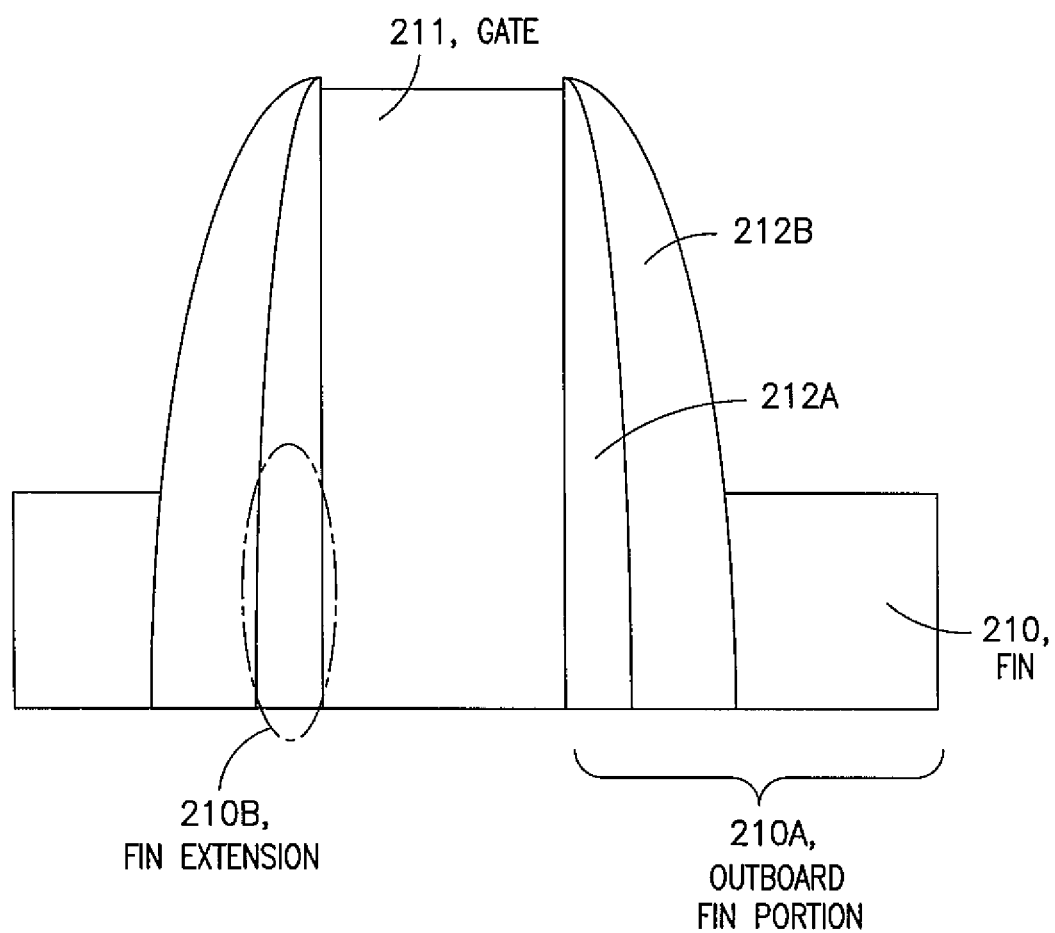
FIG. 2C is a sectional view along the section line of FIG. 2A.

FIG. 2C illustrates the same relation along the sectional view taken along the line C-C of FIG. 2A. The LDD extension region of the fin 210 is shown at FIG. 2C as the fin extension 210B and is formed by the first spacer layer 212A. In some embodiments the fin 210 itself may be notched in this area such that at least some of the fin extension 210B lies within the lateral edges of the fins shown at FIG. 2A. Beyond the LDD extension region at 210B the outboard fin portion 210A are the source and drain HDD regions.

Figure 4A:
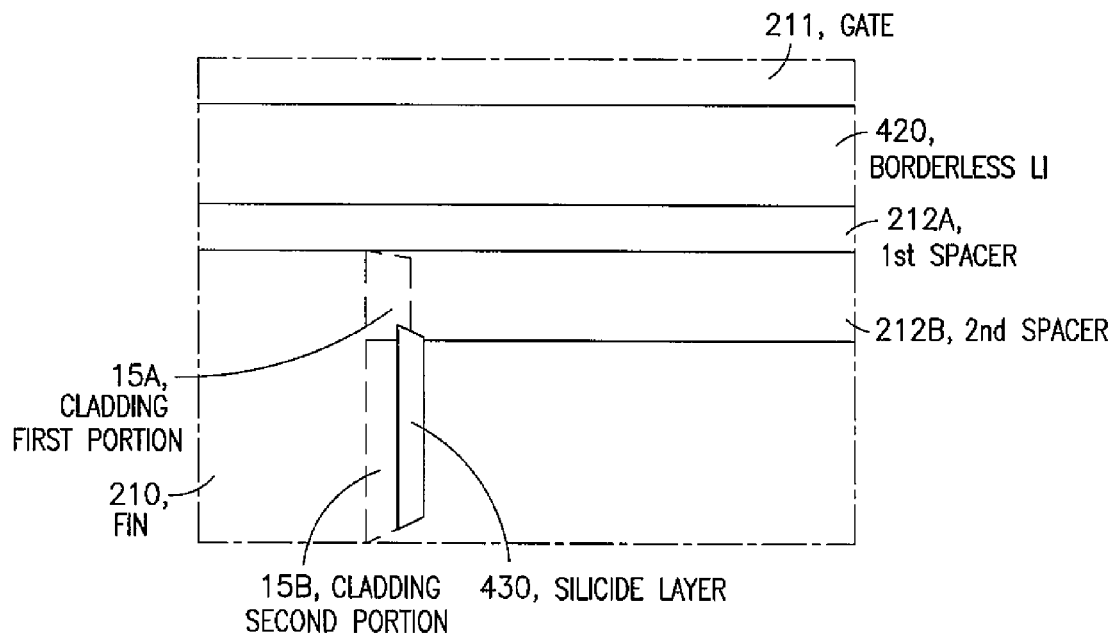
FIGS. 4A-D illustrate a further alternative embodiment having a borderless local interconnect.
Figure 4B:
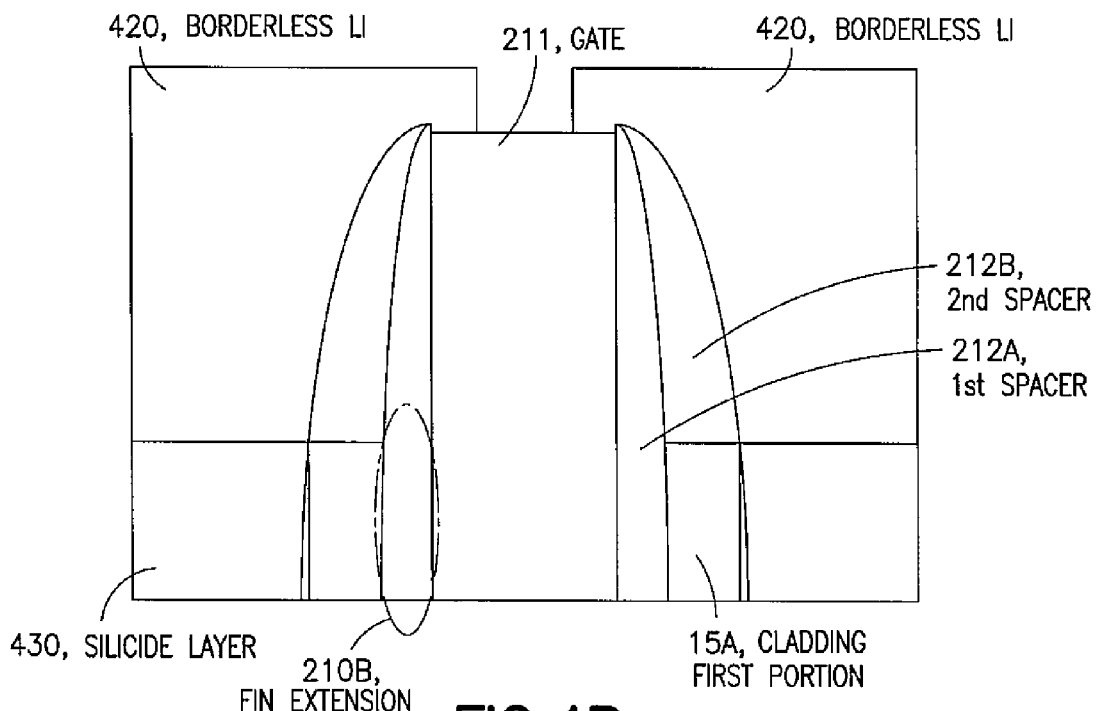
Figure 4C:
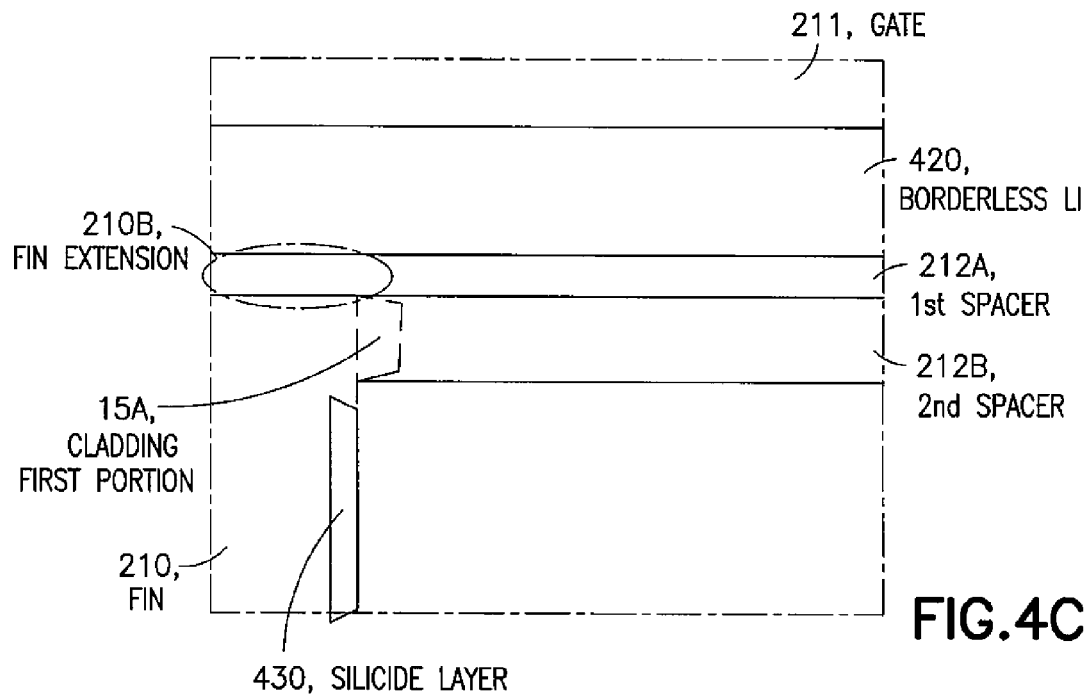

FIG. 2B is an expanded view of the inset from FIG. 2A that more particularly shows the relevant capacitances and dopant diffusions. This twin (or more) spacer approach allows the first spacer layer 212A to set the overlay capacitance $C_{ov}$ which also sets ingress of dopant from, the cladding layer 15 into the fin extensions 210B which itself is formed of the first layer 212A. As charge carriers (electrons or holes) move towards the high-K first spacer layer 212A the dopants move in the direction of the downward-directed arrow (dopant diffusion) in FIG. 2C and are diffused as indicated by the dashed oval. Presence of these two layers 212A, 212B also allows for a larger separation between the gate 211 and the epi-merge source and drain regions 15 that are used to electrically merge the fins 210. FIGS. 4A-C show that this twin spacer layer approach also allows for a larger separation if there is a local interconnect as the electrical contact between sources and drains instead of the epi-merge region 14.

Note that in FIGS. 2A and 2C the second spacer layer 212B overlies the cladding layer 15 on the sidewall of the outboard fin portion 210A but the first spacer layer 212A does not. Unlike the portion of the fin 210 which the gate 211 overlies, the cladding layer 15 does not pass under the gate but instead is separated from the gate 211 itself by the first spacer layer 212A that forms the fin extension 210B. This arrangement better enables the overlay capacitance $C_{ov}$ of the first spacer layer 212A to set the ingress of dopant from the cladding layer 15 to the fin extension 210B/LDD extension region.

Very small transistors suffer from short channel effects due to their reduced channel length between source and drain as mentioned above. One short channel effect is drain induced barrier lowering; shorter channel lengths correspond to reductions in the potential barrier between the source and drain. This degrades the sub-threshold swing in deep sub-micron devices because increasing the drain voltage increases the depletion region around the drain and the corresponding drain electric field reduces the channel potential barrier. This tends to increase the off-state or leakage current between the source and drain. One way to control drain induced barrier lowering is to have a lower dopant concentration in the junction itself and high doping concentrations outside. One advantage of this doping profile is that it yield a lower short channel degradation yet still exhibits low access resistance.

With reference to FIG. 2C, the illustrated device lies atop a silicon or silicon on insulator substrate. The dopant ions migrating from the cladding layer 15 into the fin extensions 210B formed by the first spacer layer 212A are moving towards that substrate and thus away from the surface. By proper selection of dopant and the geometry and material (K value) of the first and second spacer layers 212A, 212B, the relative dopant concentrations mentioned above can be designed into the device to limit leakage current.

Figure 3A:
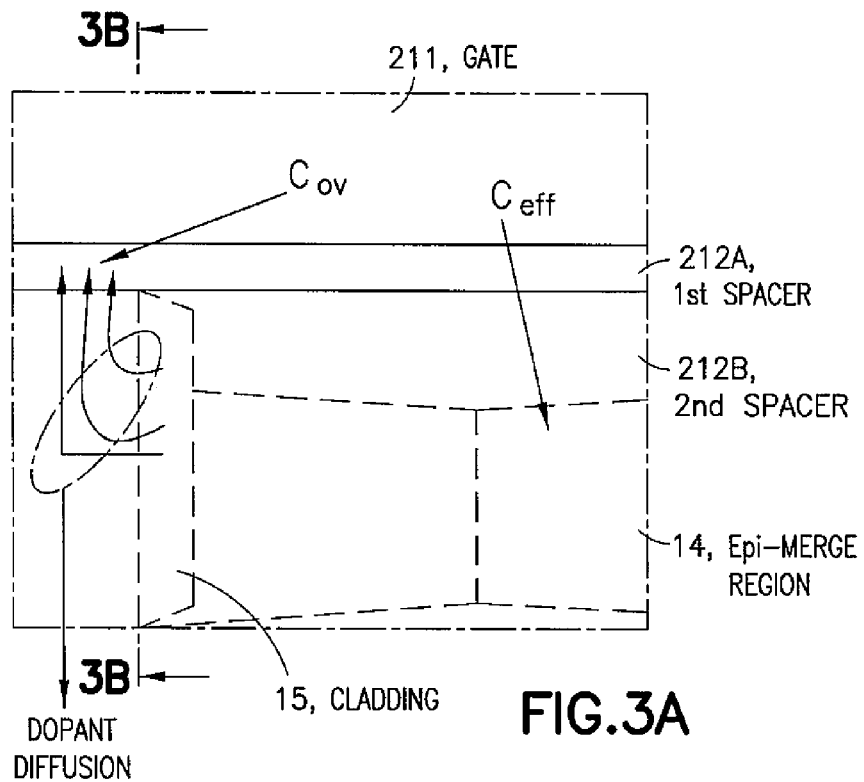
FIGS. 3A-D are schematic illustrations of an alternative embodiment in which only a portion of the cladding layer is present as compared to that of FIGS. 2A-C.
Figure 3B:
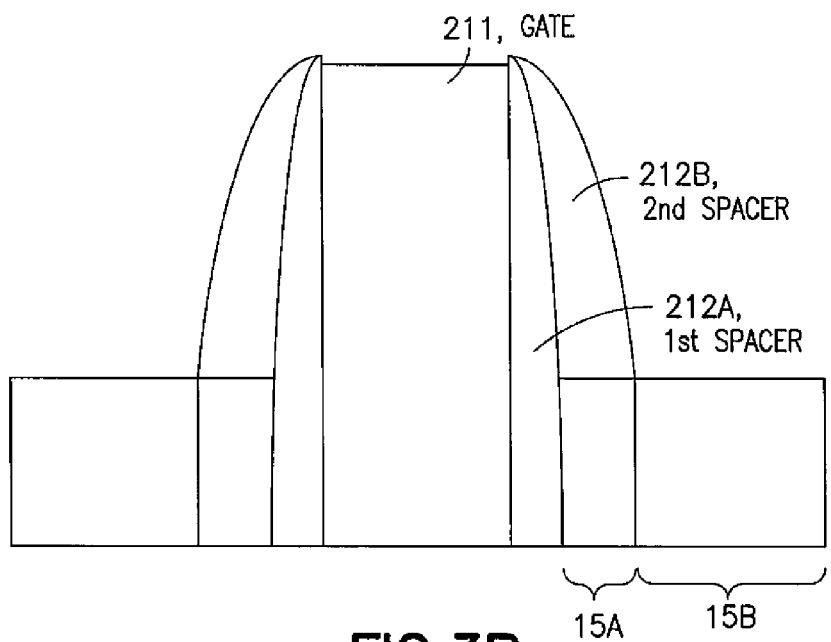

Further in this regard FIGS. 3A-D illustrate an alternative embodiment in which the cladding layer 15 is present only where it is overlain by the second spacer layer 212B. Like reference numbers in FIGS. 3A-B are substantially similar to those same reference numbers previously detailed. FIG. 3A is similar to FIG. 2B but for FIG. 3A the device is not yet fully formed. FIG. 3B is the view along section line B-B of FIG. 3A and shows that during this interim manufacturing step the cladding layer 15 is as shown for FIG. 2B in that there is a first cladding portion 15A that underlies the second spacer layer 212B and a second cladding portion 15B that extends from the first cladding portion 15A away from the gate 211.

Figure 3C:
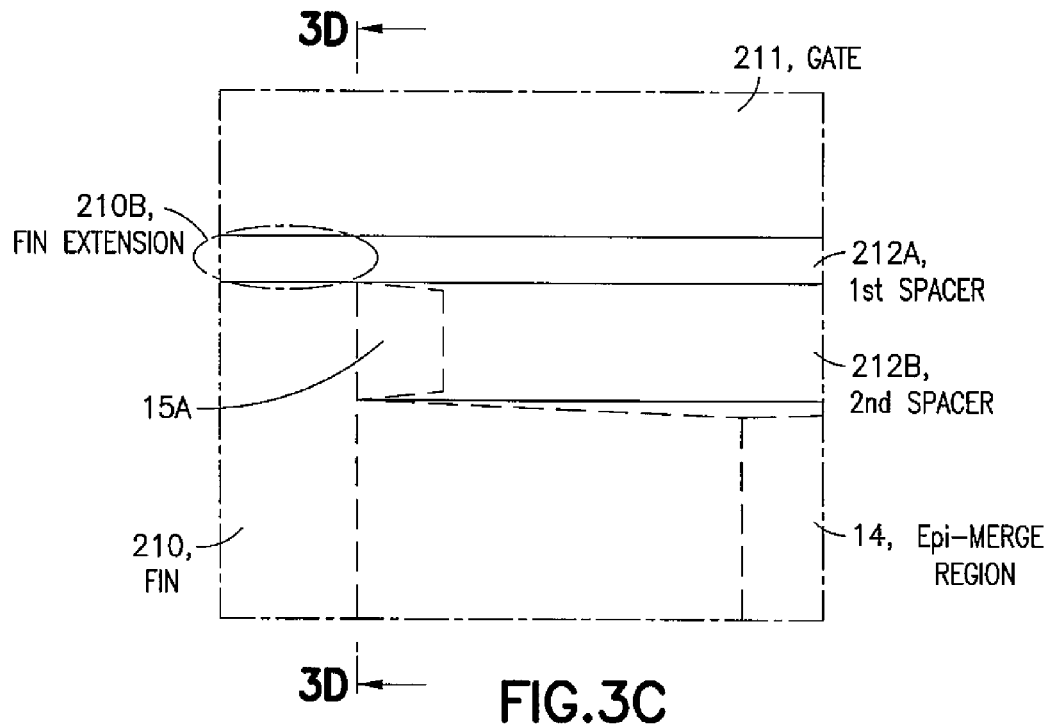
Figure 3D:
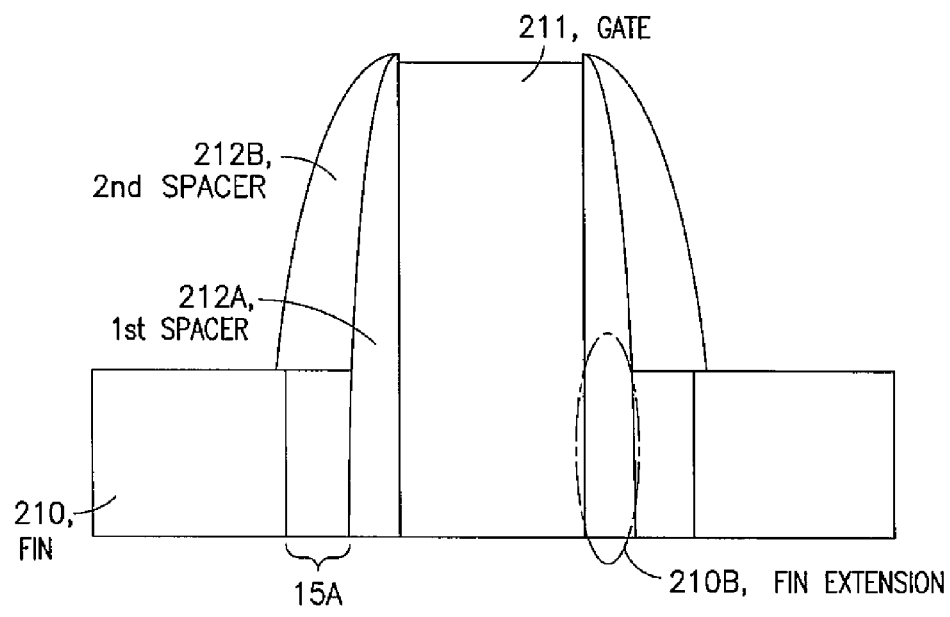

During or after the manufacturing step at which the second spacer layer 212B is etched, the second portion 15B of the cladding layer 15 is removed, preferably also by a semiconductor etch process. The end result and the finished FinFET device is shown at FIGS. 3C-D, where FIG. 3D is the view along section line D-D of FIG. 3C. In the region beyond the second spacer layer 212B the cladding portion 15B is removed so the common source/drain region is directly in contact with the fin 210 with no cladding therebetween. The only portion 15A of cladding that remains in the finished finFET device underlies the second spacer layer 212B.

FIGS. 4A-D illustrate a further alternative embodiment. Conventional metallization becomes more difficult as device density increases and device sizes are reduced so local interconnects have been used to electrically interconnect structures at close distances such as between the gate and drain of an individual finFET device. Local interconnects are typically formed over the fins and would lie in the epi-merge region shown at FIG. 1B, but the local interconnect generally has a much higher dimension perpendicular to the silicon or SOI substrate. Local interconnect have a much larger exposed source/drain contact area facing the gate in the width direction which greatly increases the density of the electric field lines, and this increases the parasitic capacitance between the gate and the contact.

FIGS. 4A-D specifically illustrate a borderless local interconnect. There is an assumed but not specifically illustrated gate oxide layer over the gate 211 in FIG. 4B so the local interconnect (LI) 420 is not shorted to the gate 211 itself. During manufacture of the device after etching the second spacer layer 212B, an additional silicide layer 430 is formed on the outboard fin portion 210A. Since the silicide 430 is formed after the second spacer layer 212B, the silicide lies beyond the edge of the second spacer layer 212B. The silicide layer 430 may overlie a portion 15B of the cladding layer 15 as FIG. 4A shows, or if that portion 15B of cladding is removed the silicide will not overlie any of the cladding layer as FIG. 4C shows but will instead be in direct contact with the fin 210 itself across the length where the portion 151B of cladding was removed. This silicide layer 430 also serves to partially align the local interconnect 420 which is grown afterwards.

In one variation of FIG. 4 the entire cladding layer 15 is removed prior to silicidation. FIGS. 4A and 4C are plan views of embodiments that differ in the cladding layer 15, but in both the local interconnect 420 extends over the fin 210 and its outboard region 210A as well as over the first 212A and second 212B spacer layers. These different layers are more evident from the sectional view of FIG. 4B which is taken along a section line similar to the section line B-B of FIG. 3A.

Figure 4D:
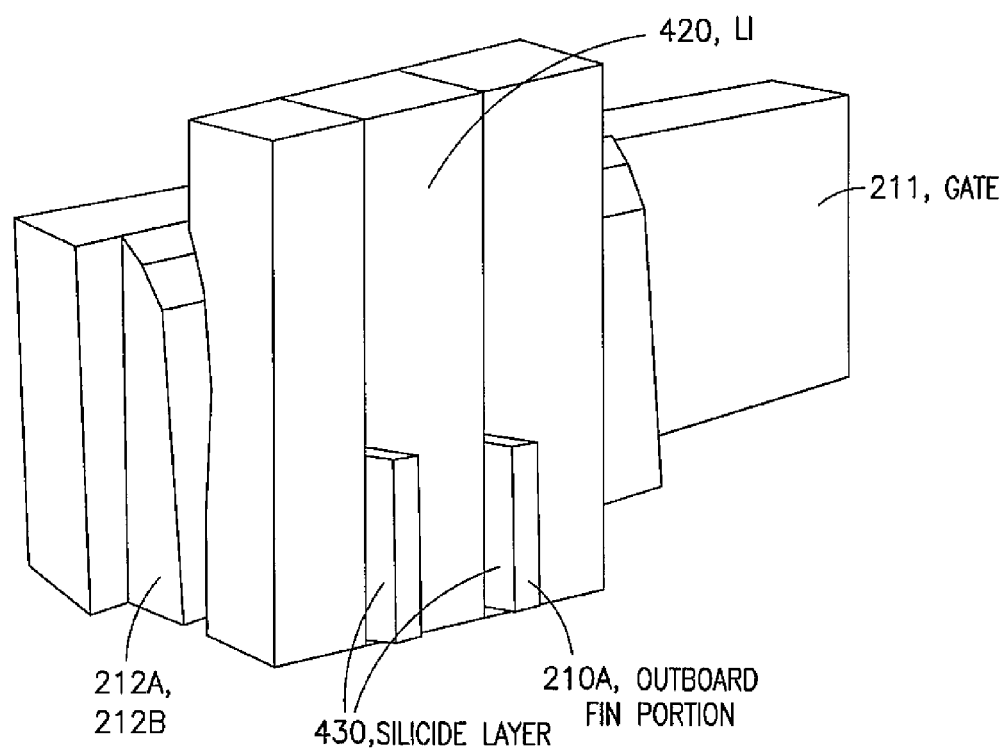

FIG. 4D is a perspective view of a similar alternative embodiment as detailed for FIGS. 4A-C. For clarity in this drawing the first and second spacer layers 212A, 212B are not separately illustrated but are clearly shown as both being disposed between the gate 211 and the local interconnect 420. There are two outboard fin portions 210A projecting beyond the local interconnect 420 to better illustrate disposition of the silicide layer 430 which is preferably on opposed sides of each outboard fin portion 210A.

Figure 1A:
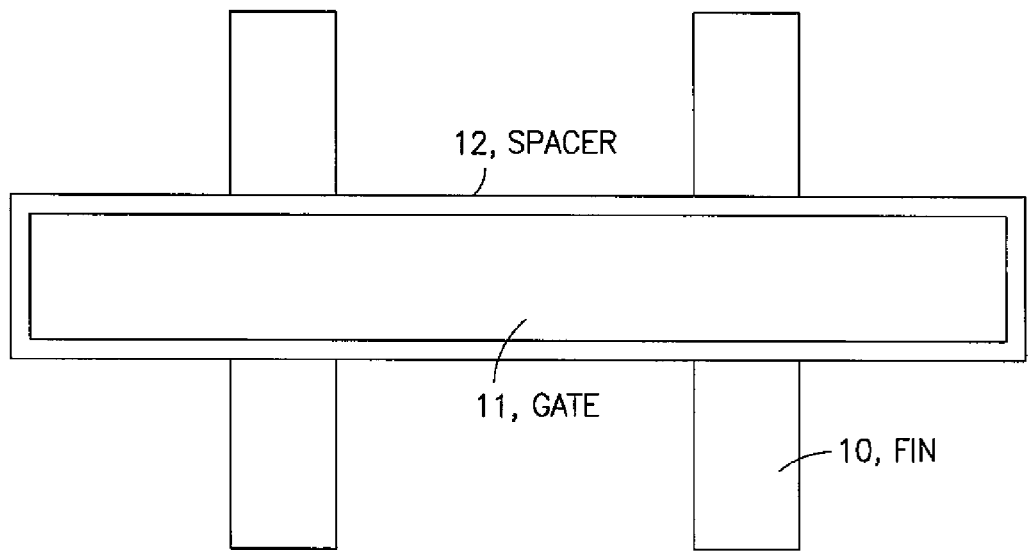
FIGS. 1A-B are schematic plan views of two fins with a common gate in a FinFET array.
Figure 1B:
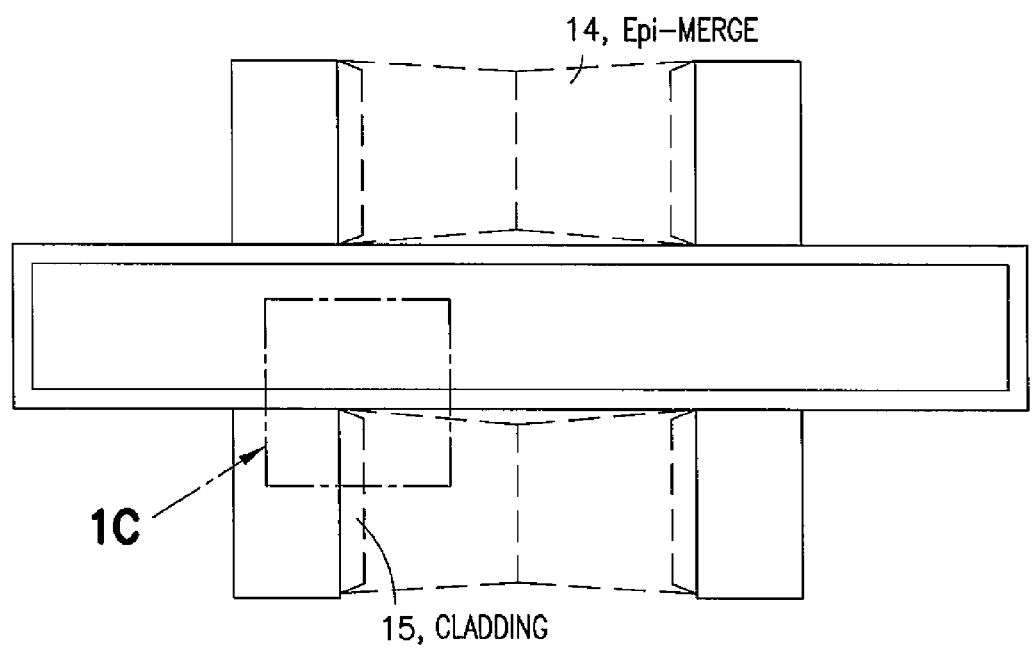
Figure 1C:
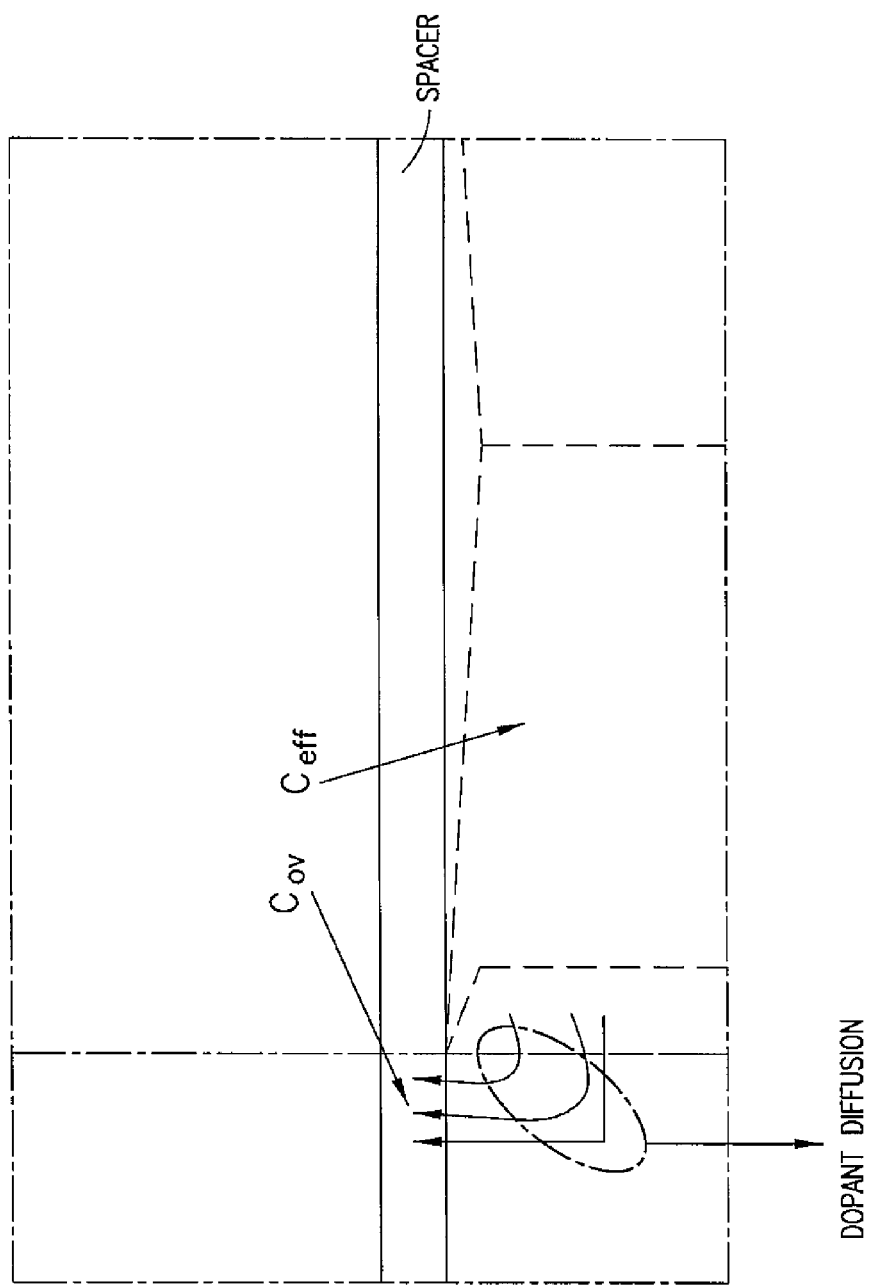
FIG. 1C is an expanded view of an inset from FIG. 1B.

FIG. 5B is a micrograph of the first embodiment taken along the section line C-C of FIG. 2A, and for comparison FIG. 5A is a micrograph taken along a similar section line of FIG. 1A. The fin extends in the direction of the dual arrow at FIGS. 5A-B and FIG. 5A shows a single spacer layer 12 having been formed in the finFET device. The embodiment of these teachings represented at FIG. 5B shows both the first spacer layer 212A and the second spacer layer 212B, where a dashed line is artificially added to better distinguish the different layers. A section of the outboard fin portion 210A that extends beyond the gate 211 is clearly covered by both the first 212A and the second 212B spacer layers in FIG. 5B, with the first spacer layer 212A forming the fin extension 210B as shown.

Figure 6:
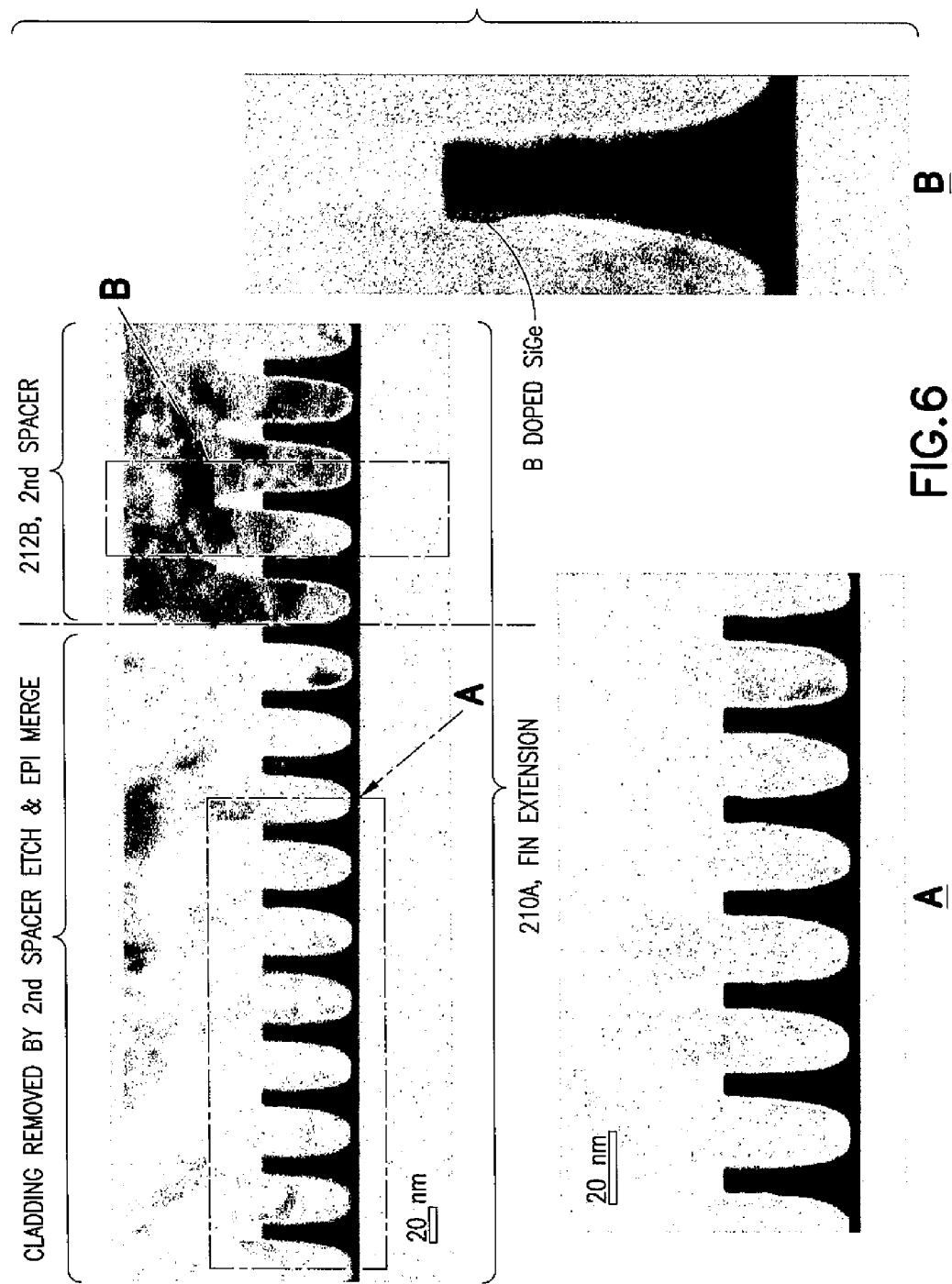
FIG. 6 are micrographs of the alternative embodiment shown at FIGS. 3A-D.

FIG. 6 are micrographs of the alternative embodiment shown schematically at FIGS. 3A-D where only a portion 15A of the cladding layer remains in the finished device. These micrographs are along a section line running with the first spacer layer 212A and at a glancing angle to the gate 211 shown in FIG. 3C; that gate 211 is disposed at the right of the larger micrograph of FIG. 6. Underlying the illustrated second spacer layer 212B the n-type or p-type wells are doped with SiGe from the portion 15A of the cladding layer 15 that was not removed, as shown in the inset micrograph at the right. Beyond the illustrated second spacer layer along the outboard fin portion 210A the n-type or p-type wells are not doped because that portion 15A of the cladding layer 15 was removed during fabrication as shown in the lower inset micrograph. Preferably that portion 15B of the SiGe cladding layer 15 was removed with the same etch that was used to etch the second spacer layer 212B.

In general, the above embodiments can be considered a fin-type field effect transistor (finFET) device, comprising a gate 211 disposed over at least two fins 210, each fin defining a source outboard portion 210A and a drain outboard portion 210A extending beyond the gate. There is a source interconnect 14, 420 that electrically connects the source outboard portions 210A of the fins 210, and similarly on the opposed side of the gate 211 there is a drain interconnect electrically connecting the drain outboard portions of the fins. A first dielectric spacer layer 212A is disposed adjacent to the gate 211 and overlying the fins 210, and a second dielectric spacer layer 212B is disposed adjacent to the first spacer layer 212A and also overlying the fins 210. The second spacer layer 212B electrically isolates the gate 211 from the drain contact 12, 420 and/or from the source contact 14, 420.

FIGS. 2-3 specifically show a cladding layer 15 disposed on sidewalls of the source and drain outboard portions 210A of the fins 210 and underlying the second dielectric spacer layer 212B. In the FIG. 3 embodiment the cladding layer 15A extends only to edges of the second dielectric spacer layer 212B and beyond said respective edges the fin 210 is in direct electrical contact with the respective source and drain contacts 14. The second dielectric spacer layer 212B controls ingress of dopant from the cladding layer to a fin extension 210B on each fin 210 that is defined by the first dielectric spacer layer 212A. In the FIG. 2-3 embodiments the source and the drain contacts comprise epitaxially grown merge regions 14.

In the embodiment shown at FIGS. 4A-D the source and drain contacts comprise local interconnects, which can be distinguished by their height being greater than a height of the fins themselves, and in this embodiment the finFET device further comprised a silicide layer 430 disposed between the fins 210 and each of the respective source and drain local interconnects 420. FIGS. 4A and 4C each show a cladding layer 15A/15B disposed between the fins 210 and each of the source and drain local interconnects 420. In FIG. 4C that cladding layer 12A extends only to edges of the second dielectric spacer layer 212B and beyond said respective edges the fin 210 and the silicide layer 430 are in direct contact with one another. In FIG. 4A the cladding layer 15B and the silicide layer 430 overlie one another, but in both cases the silicide layer does not underlie the second spacer layer 212B.

It is notable that the choice of the first and second dielectric spacer layers 212A/212B can be determinative of the device's polarity, whether the device is a p-type FET or an n-type FET. This means that during manufacture when there are many such devices such as those shown in FIG. 2A (two fins and a common gate), different regions of the wafer on which different finFET devices are formed can be block masked such that some chips cut from that wafer will have finFET devices according to these teachings that are p-FETS while other chips cut from that same wafer will have finFET devices according to these teachings that are n-FETS. Differential block masking can occur over different regions of the same chip also, so a given chip might have some p-FET devices and some n-FET devices all consistent with the above dual spacer layer teachings.

Such finFET devices include, but are not limited to, semiconductor devices such as MOSFETs. However, it should be understood that the disclosed embodiments are merely illustrative of the claimed structures and methods that may be embodied in various forms. The structures and methods disclosed herein may be embodied in many different forms and should not be construed as limited to the exemplary embodiments set forth herein.

When manufacturing a finFET according to these teachings, a SOI substrate for example is formed into a base semiconductor structure comprising the base layer, an insulator layer, and a plurality of fins formed from the semiconductor layer. A fin is defined as a contiguous structure comprising a semiconductor material (doped or undoped) and including a pair of substantially vertical sidewalls that are parallel to each other. As shown above, fins are spaced apart from each other and are oriented parallel to each other. A bottom surface of each fin is in direct contact with an upper surface of the insulator layer. Each fin is about 4 nm to about 6 nm in thickness.

The fins are formed in the semiconductor layer using, for example, lithography and etching techniques. One exemplary lithography technique may include forming a photoresist on the topmost surface of the semiconductor layer, exposing the photoresist to a desired pattern of radiation, and then developing the exposed photoresist with a conventional resist developer to provide a patterned photoresist on the semiconductor layer. At least one etching technique is then employed which transfers the pattern from the patterned photoresist into the semiconductor layer utilizing the underlying insulator layer as an etch stop. In one exemplary embodiment, the etch used for pattern transfer may include a dry etch process such as, for example, reactive ion etching (RIE), plasma etching, ion beam etching, or laser ablation. In another exemplary embodiment, the etch used for pattern transfer may include a wet chemical etchant such as, for example, KOH (potassium hydroxide). In yet another embodiment, a combination of a dry etch and a wet chemical etch may be used to transfer the pattern. After transferring the pattern into the semiconductor layer, the patterned photoresist can be removed utilizing a conventional resist stripping process such as, for example, ashing.

In some embodiments, a hardmask such as, for example, a dielectric oxide can be formed by, for example, a deposition process, on the topmost surface of the semiconductor layer prior to application of the photoresist. In such an embodiment, the pattern from the patterned photoresist is first transferred into the hardmask and then into the underlying semiconductor layer. The patterned photoresist may be removed at any point after the hardmask has been patterned. Remaining portions of the hardmask may be removed by performing a planarization process. In one exemplary embodiment, a semiconductor material is epitaxially grown or otherwise formed on the substantially vertical sidewalls and top surfaces of the fins. As used herein, "epitaxially grown" refers to the growth of a semiconductor material on a deposition surface of a semiconductor material, in which the semiconductor material being grown has the same (or substantially the same) crystalline characteristics as the semiconductor material of the deposition surface.

In embodiments in which a hardmask is deposited on the topmost surface of the semiconductor layer prior to application of the photoresist, the hardmask material may be deposited using low pressure chemical vapor deposition (LPCVD). Hardmask materials that may be deposited on the topmost surface of the semiconductor layer include, but are not limited to, any nitride-based dielectric material such as SiN, $Si_3N_4$, silicon carbon nitride, combinations of the foregoing materials, and the like.

Once the fins are formed the gate may be disposed thereupon, and in some embodiments a dummy gate structure may be deposited to serve as placeholders which are subsequently removed and replaced with metal gate structures; see for example co-owned U.S. patent application Ser. No. 14/518,281 filed on Oct. 20, 2014 entitled Method and Structure for III-IV FinFET, the contents of which are hereby incorporated by reference. The first and second spacer layers are deposited or grown serially on the gate, each process terminating with an etch step that defines edges of the respective layer.

As noted above, a cladding layer may be deposited on the fin sidewalls after etching the first spacer layer, and for the embodiment of FIGS. 3A-D a portion of that cladding layer can be removed when etching the edges of the second spacer layer. For the local interconnect embodiment of FIGS. 4A-D the silicide layer can be grown or deposited after the second spacer layer is etched. In any case the epi-merge contact region or the local interconnect is grown or deposited after completion of processing for the cladding and/or silicide layers.

Without limiting the scope of these teachings, some exemplary materials for the first spacer layer include SiO, SiOCN, SiOC, SiON, SiBCN and SiN; and for the second spacer layer include SiO, SiN, SiON, SiBCN, SiOCN and SiOC. Preferably the first spacer defines a thickness between about 2-10 nm; and the second spacer defines a thickness of about 5-10 nm.

The example spacer films listed above are recited in order of increasing K value, which typically scales with robustness towards etch and erosion. So for example it may be prudent to select a weak yet low K film (SiO or SiOCN for example) for the first spacer and a more robust at the expense of K value film for the outer second spacer (SiBCN or SiN for example). Some exemplary and non-limiting dopants were mentioned above: arsenic and phosphorous for nFETs and boron for pFETs.

According to another aspect of these teachings there is a method of making a finFET device, comprising: disposing a gate 211 over at least two fins 210, each fin defining a source outboard portion 210A and a drain outboard portion 210A extending beyond the gate 211. After that there is disposed a first dielectric spacer layer 212A adjacent to the gate 211 and overlying the fins 210; and then a second dielectric spacer layer 212B is disposed adjacent to the first dielectric spacer layer 212A and overlying the fins 210. The source outboard portions 210A of the fins 210 are electrically connected via a source contact 14, 420 such that the second dielectric spacer layer 212B electrically isolates the gate 211 from the source contact, and/or the drain outboard portions 210A of the fins 210 are electrically connected via a drain contact 14, 420 such that the second dielectric spacer layer 212B electrically isolates the gate 211 from the drain contact.

To achieve the embodiments shown at FIGS. 2-4, between disposing the first and second dielectric spacer layers 212A, 212B there is disposed a cladding layer 15 on sidewalls of the source and drain outboard portions 210A of the fins 210, such that once the second dielectric spacer layer 212B is disposed it overlies the cladding layer 15. For the specific embodiments shown at FIGS. 3C-D and 4C when etching the second dielectric spacer layer 212B, portions 15B of the cladding layer 15 are removed that extend beyond edges of the second dielectric spacer layer 212B that are defined by the etching. For all the cladding layer embodiment the cladding layer may define a dopant and the second dielectric spacer layer 212B controls ingress of the dopant from the cladding layer 15 to a fin extension 210B on each fin 210 that is defined by the first dielectric spacer layer 212A. For the FIG. 2-3 embodiments the source and the drain contacts comprise epitaxially grown merge regions 14.

The embodiment of FIGS. 4A-D shows that the source and drain contacts comprise local interconnects 420 defining a height greater than a height of the fins, and to make the FIG. 4 embodiment a silicide layer 430 is disposed along sidewalls of the fins 210, after disposing the second dielectric spacer layer 212B and before electrically connecting the source and drain outboard portions 201A. For the local interconnect embodiments above a cladding layer 15 is also disposed on sidewalls of the source and drain outboard portions 210A of the fins 210, between the times when the first and second dielectric spacer layers are disposed. Specifically for the FIG. 4C embodiment, when etching the second dielectric spacer layer 212B there is also removed portions 15B of the cladding layer 15 that extend beyond edges of the second dielectric spacer layer 212B that are themselves defined by the etching.

When forming multiple finFET devices on a same wafer, a first of these finFET devices can define p-type FETs while a second of these finFET devices can define n-type FETs. It is the first and second dielectric spacer layers of these respective first and second finFET devices that are determinative of the respective p-type FET and n-type FET, and so during manufacture the regions of the wafer at which the first and second finFETs are formed are separately block masked while disposing the first and second dielectric spacer layers, which are different materials as between the first and second finFET devices.

In the foregoing description, numerous specific details are set forth, such as particular structures, components, materials, dimensions, processing steps, and techniques, in order to provide a thorough understanding of the exemplary embodiments disclosed herein. However, it will be appreciated by one of ordinary skill of the art that the exemplary embodiments disclosed herein may be practiced without these specific details. Additionally, details of well-known structures or processing steps may have been omitted or may have not been described in order to avoid obscuring the presented embodiments. It will be understood that when an element as a layer, region, or substrate is referred to as being "on" or "over" another element, it can be directly on the other element or intervening elements may also be present. In contrast, when an element is referred to as being "directly on" or "directly" over another element, there are no intervening elements present. It will also be understood that when an element is referred to as being "beneath" or "under" another element, it can be directly beneath or under the other element, or intervening elements may be present In contrast, when an element is referred to as being "directly beneath" or "directly under" another element, there are no intervening elements present.

The description of the present invention has been presented for purposes of illustration and description, but is not intended to be exhaustive or limiting in the form disclosed. Many modifications and variations will be apparent to those of ordinary skill in the art without departing from the scope of the invention. The embodiments were chosen and described in order to best explain the principles of the invention and the practical applications, and to enable others of ordinary skill in the art to understand the invention for various embodiments with various modifications as are suited to the particular uses contemplated.

What is claimed is:

1. A fin-type field effect transistor (finFET) device, comprising:
 a gate disposed over at least two fins, each fin defining a source outboard portion and a drain outboard portion extending beyond the gate;
 a source contact electrically connecting the source outboard portions of the fins;
 a drain contact electrically connecting the drain outboard portions of the fins;
 a first dielectric spacer layer disposed adjacent to the gate and overlying the fins;
 a second dielectric spacer layer disposed adjacent to the first dielectric spacer layer and overlying the fins, the second dielectric spacer layer electrically isolating the gate from the drain contact and/or from the source contact; and
 a cladding layer disposed on sidewalls of the source and drain outboard portions of the fins, said cladding layer underlying the second dielectric spacer layer such that dopant ingress from the cladding layer to the source and drain outboard portions are defined by an overlay capacitance $C_{ov}$ of the first dielectric spacer layer.

2. The finFET device according to claim 1, wherein the cladding layer extends only to edges of the second dielectric spacer layer that lie opposite the first dielectric spacer layer, and beyond said respective edges the fin is in direct electrical contact with the respective source and drain contacts.

3. The finFET device according to claim 1, wherein the second dielectric spacer layer controls ingress of dopant from the cladding layer to a fin extension on each fin defined by the first dielectric spacer layer.

4. The finFET device according to claim 1, wherein the source and the drain contacts comprise epitaxially grown merge regions.

5. The finFET according to claim 1, wherein the source and drain contacts comprise local interconnects defining a height greater than a height of the fins,
 and the finFET device further comprising a silicide layer disposed between the fins and each of the respective source and drain local interconnects.

6. The finFET device according to claim 5, wherein the cladding layer extends beyond the second dielectric spacer layer to lie between the fins and each of the source and drain local interconnects.

7. The finFET according to claim 5, wherein the cladding layer extends only to edges of the second dielectric spacer layer that lie opposite the first dielectric spacer layer and beyond said respective edges the fin and the silicide layer are in direct contact with one another.

8. A wafer comprising at least two finFET devices according to claim 1, wherein a first of the said finFET devices defines p-type FETs and a second of the said finFET devices defines n-type FETs, wherein the first and second dielectric spacer layers of the respective first and second finFET devices are determinative of the respective p-type FET and n-type FET.

9. The finFET device according to claim 1, wherein the first dielectric spacer layer does not overlie the cladding layer, and the cladding layer is separated from the gate by the first dielectric spacer layer.

10. The finFET device according to claim 9, wherein the cladding layer lies entirely under the second dielectric spacer layer.

11. A method of making a fin-type field effect transistor (finFET) device, comprising:
   disposing a gate over at least two fins, each fin defining a source outboard portion and a drain outboard portion extending beyond the gate;
   disposing a first dielectric spacer layer adjacent to the gate and overlying the fins;
   disposing a cladding layer on sidewalls of the source and drain outboard portions of the fins;
   disposing a second dielectric spacer layer adjacent to the first dielectric spacer layer such that the second dielectric layer overlies the cladding layer and overlies the fins;
   electrically connecting the source outboard portions of the fins via a source contact such that the second dielectric spacer layer electrically isolates the gate from the source contact such that dopant ingress from the cladding layer to the source outboard portions are defined by an overlay capacitance $C_{ov}$ of the first dielectric spacer layer; and/or
   electrically connecting the drain outboard portions of the fins via a drain contact such that the second dielectric spacer layer electrically isolates the gate from the drain contact such that dopant ingress from the cladding layer to the drain outboard portions are defined by an overlay capacitance $C_{ov}$ of the first dielectric spacer layer.

12. The method according to claim 11, further comprising:
   when etching the second dielectric spacer layer, removing portions of the cladding layer that extend beyond edges of the second dielectric spacer layer that are defined by the etching.

13. The method according to claim 11, wherein the cladding layer defines a dopant and the second dielectric spacer layer controls ingress of the dopant from the cladding layer to a fin extension on each fin that is defined by the first dielectric spacer layer.

14. The method according to claim 11, wherein the source and the drain contacts comprise epitaxially grown merge regions.

15. The method according to claim 11, wherein the source and drain contacts comprise local interconnects defining a height greater than a height of the fins,
   and the method further comprises, after disposing the second dielectric spacer layer and before electrically connecting the source and drain outboard portions, disposing a silicide layer along sidewalls of the fins.

16. The method according to claim 10 performed on at least two finFET devices on a same wafer, wherein
   a first of the said finFET devices defines p-type FETs and a second of the said finFET devices defines n-type FETs, wherein the first and second dielectric spacer layers of the respective first and second finFET devices are determinative of the respective p-type FET and n-type FET and the regions of the wafer at which the first and second finFETs are formed are separately block masked while disposing the first and second dielectric spacer layers.

17. A method of making a fin-type field effect transistor (finFET) device, comprising:
   disposing a gate over at least two fins, each fin defining a source outboard portion and a drain outboard portion extending beyond the gate;
   disposing a first dielectric spacer layer adjacent to the gate and overlying the fins;
   disposing a cladding layer on sidewalls of the source and drain outboard portions of the fins;
   disposing a second dielectric spacer layer adjacent to the first dielectric spacer layer and overlying the fins;
   when etching the second dielectric spacer layer, removing portions of the cladding layer that extend beyond edges of the second dielectric spacer layer that are defined by the etching;
   electrically connecting the source outboard portions of the fins via a source contact such that the second dielectric spacer layer electrically isolates the gate from the source contact; and/or
   electrically connecting the drain outboard portions of the fins via a drain contact such that the second dielectric spacer layer electrically isolates the gate from the drain contact.

* * * * *